(12) United States Patent
Marić et al.

(10) Patent No.: US 12,101,918 B2
(45) Date of Patent: *Sep. 24, 2024

(54) NOISE MITIGATION FOR HEAD-MOUNTED DEVICE

(71) Applicant: Apple Inc., Cupertino, CA (US)

(72) Inventors: Ivan S. Marić, Sunnyvale, CA (US); Aidan N Zimmerman, Sunnyvale, CA (US); Phil M. Hobson, Menlo Park, CA (US); Jonathan C Atler, Mountain View, CA (US); Arash Naghib Lahouti, San Jose, CA (US); Jesse T. Dybenko, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/225,036

(22) Filed: Jul. 21, 2023

(65) Prior Publication Data

US 2023/0363123 A1    Nov. 9, 2023

Related U.S. Application Data

(63) Continuation of application No. 16/783,049, filed on Feb. 5, 2020, now Pat. No. 11,758,702.
(Continued)

(51) Int. Cl.
*G09G 5/00* (2006.01)
*G10K 11/175* (2006.01)
(Continued)

(52) U.S. Cl.
CPC ....... *H05K 7/20972* (2013.01); *G10K 11/175* (2013.01); *H04N 5/655* (2013.01);
(Continued)

(58) Field of Classification Search
CPC ... G06T 19/006; G06T 13/40; G06T 2200/24; G06T 15/20; G06T 19/20;
(Continued)

(56) References Cited

U.S. PATENT DOCUMENTS 3,227,240 A    1/1966   Lee et al.
7,394,909 B1   7/2008   Widmer et al.
(Continued)

FOREIGN PATENT DOCUMENTS

CN    103946732 A    7/2014
CN    106104361 A    11/2016
(Continued)

OTHER PUBLICATIONS

Chinese Office Action from Chinese Patent Application No. 202010341648.0, dated X Nov. 23, 2023, 10 pages including machine-generated English language translation.

*Primary Examiner* — Insa Sadio
(74) *Attorney, Agent, or Firm* — BAKERHOSTETLER (57) ABSTRACT

A head-mounted device can effectively manage heat while also managing noise output in a manner that reduces the user's perception thereof. For example, a support member extending across a flow channel can provide multiple sections with different profiles and/or cross-sectional dimensions within the flow channel. Each of the profiles and/or cross-sectional dimensions can generate tonal noises at different frequencies, so that the tonal noises generated are distributed across multiple frequencies to mask such tonal noises among broadband noises that are generated by the head-mounted device. Such a support member can be moveably positioned within the flow channel and rigidly coupled to other components of the head-mounted device. Such a support member can also be used to draw heat away from (Continued)

other components of the head-mounted device to be dissipated by the flow of air within the flow channel.

20 Claims, 7 Drawing Sheets

Related U.S. Application Data (60) Provisional application No. 62/840,663, filed on Apr. 30, 2019.

(51) Int. Cl.
*H04N 5/655* (2006.01)
*H04N 23/54* (2023.01)
*H04N 23/90* (2023.01)
*H05K 7/20* (2006.01)
*G02B 27/01* (2006.01)

(52) U.S. Cl.
CPC ............ *H04N 23/54* (2023.01); *H04N 23/90* (2023.01); *G02B 27/0176* (2013.01)

(58) Field of Classification Search
CPC . G06T 2207/30201; G06T 2207/30252; G06T 7/60; G06T 1/0007; G06T 11/60; G06T 15/00; G06T 15/10; G06T 19/003; G06T 2207/30196; G06T 2215/16; G06T 2219/024; G06T 2219/2016; G06T 3/4038; G06T 7/70; G06T 7/75
See application file for complete search history.

(56) References Cited

U.S. PATENT DOCUMENTS

| | | | |
|---|---|---|---|
| 9,839,166 B2 | 12/2017 | Kim et al. | |
| 2016/0255748 A1* | 9/2016 | Kim | G02B 27/017 361/695 |
| 2017/0184863 A1 | 6/2017 | Balachandreswaran et al. | |
| 2017/0311483 A1 | 10/2017 | Kawai | |
| 2018/0307282 A1* | 10/2018 | Allin | G02B 27/0176 |
| 2018/0348812 A1 | 12/2018 | Miller | |

FOREIGN PATENT DOCUMENTS

| | | |
|---|---|---|
| CN | 106646871 A | 5/2017 |
| CN | 106937195 A | 7/2017 |
| CN | 107209382 A | 9/2017 |
| CN | 207969271 U | 10/2018 |
| EP | 3410174 A1 | 12/2018 |
| WO | WO 2012/017478 | 2/2012 |
| WO | WO 2019/000556 | 1/2019 |

* cited by examiner

NOISE MITIGATION FOR HEAD-MOUNTED DEVICE

CROSS-REFERENCE TO RELATED APPLICATIONS

This application is a continuation of U.S. application Ser. No. 16/783,049, entitled "MITIGATION FOR HEAD-MOUNTED DEVICE," filed Feb. 5, 2020, which claims the benefit of U.S. Provisional Application No. 62/840,663, entitled "NOISE MITIGATION FOR HEAD-MOUNTED DEVICE," filed Apr. 30, 2019, the entirety of each of which are incorporated herein by reference.

TECHNICAL FIELD

The present description relates generally to head-mounted devices, and, more particularly, to cooling and noise mitigation for head-mounted devices.

BACKGROUND

A head-mounted device can be worn by a user to display visual information within the field of view of the user. The head-mounted device can be used as a virtual reality (VR) system, an augmented reality (AR) system, and/or a mixed reality (MR) system. A user may observe outputs provided by the head-mounted device, such as visual information provided on a display. The display can optionally allow a user to observe an environment outside of the head-mounted device. Other outputs provided by the head-mounted device can include speaker output and/or haptic feedback. A user may further interact with the head-mounted device by providing inputs for processing by one or more components of the head-mounted device. For example, the user can provide tactile inputs, voice commands, and other inputs while the device is mounted to the user's head.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Head-mounted devices, such as head-mounted displays, headsets, visors, smartglasses, head-up display, etc., can perform a range of functions that are managed by the components (e.g., sensors, circuitry, and other hardware) included with the wearable device. The head-mounted device can provide a user experience that is immersive or otherwise natural so the user can easily focus on enjoying the experience without being distracted by the mechanisms of the head-mounted device.

Components of a head-mounted device can generate heat during operation. Excessive heat for long durations of time can damage the components of the head-mounted device and cause discomfort to the user. Heat can be mitigated in a number of ways, including with active mechanisms (e.g., air movers) that are integrated into the head-mounted device. However, operation of active cooling mechanisms (e.g., air movers) can generate noise that may interfere with the user's desired experience with the head-mounted device. In particular, head-mounted devices are in close proximity to the ears of the user wearing the head-mounted device while in use. Thus, any noise generated may be readily perceived by the user.

To dissipate heat, a blower can be used to move air through a flow channel within the head-mounted device. Certain objects, such as support members, may be present within the flow channel for a variety of reasons. For example, they may rigidly couple together other components that are positioned on opposing sides of the flow channel. By further example, they may provide heat dissipation properties by drawing heat away from other components and into the flow channel to be cooled. The blower and other components of the head-mounted device can generate broadband noise across a broad range of frequencies. However, objects within the flow channel, when exposed to the air flow, can generate tonal aero-acoustic noises that are within a distinct enough frequency range to be perceived by the user. For example, tonal noises can be perceived as whistling or high pitched noises caused by the periodic shedding of vortices behind the component within the flow channel.

Systems of the present disclosure can provide a head-mounted device that effectively manages heat while also managing noise output in a manner that reduces the user's perception thereof. For example, a support member extending across a flow channel can provide multiple sections with different profiles and/or cross-sectional dimensions within the flow channel. Each of the profiles and/or cross-sectional dimensions can generate tonal noises at different frequencies, so that the tonal noises generated are distributed across multiple frequencies, making it possible to mask such tonal noises among broadband noises that are generated by the head-mounted device. Such a support member can be moveably positioned within the flow channel and rigidly coupled to other components of the head-mounted device, such as a camera on an outer side of the head-mounted device and a display module on an inner side of the head-mounted device. Such a support member can also be used to draw heat away from other components of the head-mounted device to be dissipated by the flow of air within the flow channel.

These and other embodiments are discussed below with reference to FIGS. 1-17. However, those skilled in the art will readily appreciate that the detailed description given herein with respect to these Figures is for explanatory purposes only and should not be construed as limiting.

Figure 1:
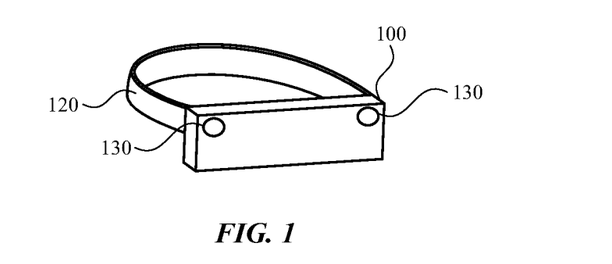
FIG. 1 illustrates a perspective view of a head-mounted device on a user, according to some embodiments of the present disclosure.

According to some embodiments, for example as shown in FIG. 1, a head-mounted device 100 includes a frame 110 that is worn on a head of a user. The frame 110 can be positioned in front of the eyes of a user to provide information within a field of view of the user. The frame 110 can provide nose pads or another feature to rest on a user's nose. The frame 110 can be supported on a user's head with the securement element 120. The securement element 120 can wrap or extend along opposing sides of a user's head. The securement element 120 can include earpieces for wrapping around or otherwise engaging or resting on a user's ears. It will be appreciated that other configurations can be applied for securing the head-mounted device 100 to a user's head. For example, one or more bands, straps, belts, caps, hats, or other components can be used in addition to or in place of the illustrated components of the head-mounted device 100. By further example, the securement element 120 can include multiple components to engage a user's head.

The frame 110 can provide structure around a peripheral region thereof to support any internal components of the frame 110 in their assembled position. For example, the frame 110 can enclose and support various internal components (including for example integrated circuit chips, processors, memory devices and other circuitry) to provide computing and functional operations for the head-mounted device 100, as discussed further herein. Any number of components can be included within and/or on the frame 110 and/or the securement element 120.

The frame 110 can include and/or support one or more camera modules 130. The camera modules 130 can be positioned on or near an outer side of the frame 110 to capture images of views external to the head-mounted device 100. The captured images can be used for display to the user or stored for any other purpose.

Figure 2:
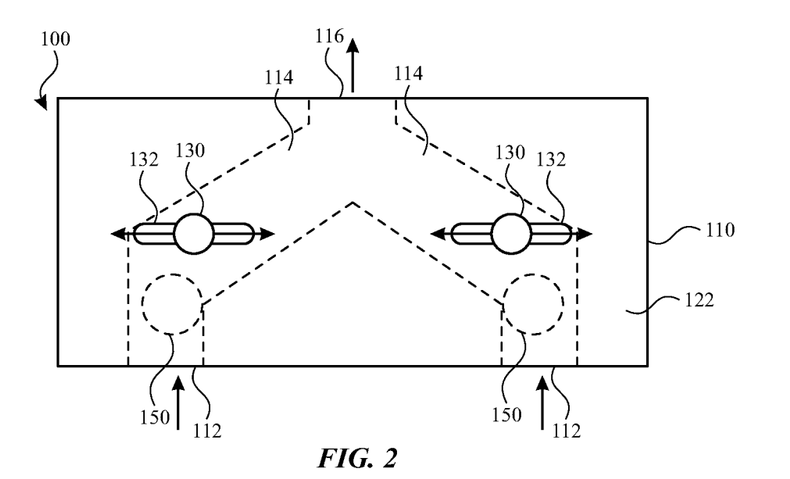
FIG. 2 illustrates a front view of a head-mounted device, according to some embodiments of the present disclosure.

Referring now to FIG. 2, a head-mounted device can be provided with a flow channel that extends through at least a portion of the frame thereof to provide cooling to components of the head-mounted device. As shown in FIG. 2, one or more flow channels 114 extend from one or more inlets 112 to one or more outlets 116. While the inlets 112 are depicted at a bottom portion of the frame 110 and the outlet 116 is depicted at a top portion of the frame 110, it will be recognized that inlets, outlets, and flow channels there between can be positioned at any portion of the head-mounted device 100. The outlet 116 can be provided at a location that will allow exiting air to exhaust to an environment that is not disruptive to the user. For example, the outlet 116 can be provided at a location and in and orientation that directs hot air away from the user. Multiple flow channels 114 can be interconnected, such that multiple inlets 112 and/or multiple outlets 116 are connected to each other.

One or more blowers 150 (e.g., fans) can be operated to provide cooling to one or more components of the head-mounted device 100. While multiple blowers 150 are shown, it will be understood that any number of blowers can be provided, each at one of a variety of positions along a flow channel 114. One or more blowers 150 can be positioned at an inlet 112, and outlet 116, or along a flow channel 114 between an inlet 112 and an outlet 116. A blower 150 can be positioned upstream and/or downstream of components to be cooled by air flow driven by the blower 150.

The blowers 150 can direct air or another gas within, against, or across one or more components of the head-mounted device 100. By way of example, the blower 150 can include multiple blades that can move to push air in a desired direction. As used herein, a blower can include any mechanism that provides mechanical movement of a gas. The examples provided herein are illustrative, rather than limiting. The blowers 150 can be operated based on one or more operating parameters that are controllable during use. The operating parameters can be determined, at least in part, based on a demand for cooling (e.g., based on a temperature of one or more components). The operating parameters can be further determined based on acceptable sound levels and characteristics to be produced by the blower 150 and along the flow channel, as discussed further herein.

As further shown in FIG. 2, camera modules 130 can be positioned on an outer side 122 of the frame 110. Each of the camera modules 130 can be movable along the outer side 122. For example, as shown in FIG. 2, a track 132 or other guide can be provided for facilitating movement of the camera module 130 therein. The camera module 130 can be supported on the outer side 122 over a portion of the flow channel 114. Accordingly, a support member (not shown) supporting the camera module 130 can extend into the flow channel 114, as discussed further herein.

While several components are shown within the frame 110, it will be understood that some or all of these components can be located anywhere within or on the head-mounted device 100. For example, one or more of these components can be positioned within the securement element of the head-mounted device 100.

Figure 3:
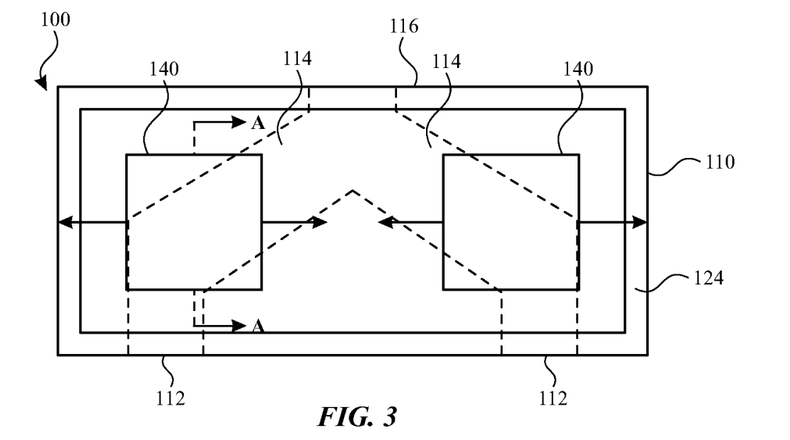
FIG. 3 illustrates a rear view of a head-mounted device, according to some embodiments of the present disclosure.

Referring now to FIG. 3, a head-mounted device can be provided with display modules that provide visual output for viewing by a user wearing the head-mounted device. As shown in FIG. 3, one or more display modules 140 can be positioned on an inner side 124 of the head-mounted device 100. For example, a pair of display modules 140 can be provided, where each display module 140 is movably positioned to be within the field of view of each of a user's two eyes. Each display module 140 can be adjusted to align with a corresponding eye of the user. For example, each display module 140 can be moved along one or more axes until a center of each display module 140 is aligned with a center of the corresponding eye.

Movement of each display modules can match movement of a corresponding camera module. For example, each display modules 140 can be supported on the inner side 124 over a portion of the flow channel 114. The same support member (not shown) can support both a camera module 130 and a display module 140, as discussed further herein.

A display module 140 can transmit light from a physical environment (e.g., as captured by a camera module) for viewing by the user. Such a display module 140 can include optical properties, such as lenses for vision correction based on incoming light from the physical environment. Additionally or alternatively, a display module 140 can provide information as a display within a field of view of the user. Such information can be provided to the exclusion of a view of a physical environment or in addition to (e.g., overlaid with) a physical environment.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mounted system may have one or more speaker(s) and an integrated opaque display. Alternatively, a head-mounted system may be configured to accept an external opaque display (e.g., a smartphone). The head-mounted system may incorporate one or more imaging sensors to capture images or video of the physical environment, and/or one or more microphones to capture audio of the physical environment. Rather than an opaque display, a head-mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

While various embodiments and aspects of the present disclosure are illustrated with respect to a head-mounted device, it will be appreciated that the subject technology can encompass and be applied to other devices. For example, a noise mitigation system in accordance with embodiments disclosed herein can be included with an electronic device that generates heat during operation. Such an electronic device can be or include a desktop computing device, a laptop computing device, a display, a television, a portable device, a phone, a tablet computing device, a mobile computing device, a wearable device, a watch, and/or a digital media player. Such devices can include a blower and flow channels to facilitate cooling as described herein.

Figure 4:
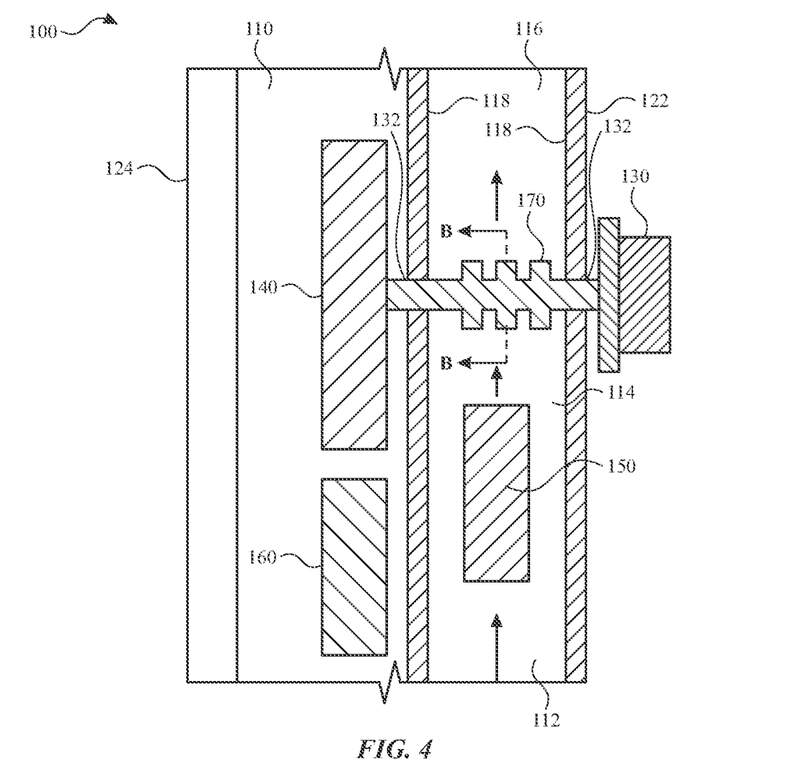
FIG. 4 illustrates a sectional view of the head-mounted device of FIG. 3 taken along line A-A, according to some embodiments of the present disclosure.

Referring now to FIG. 4, a support member can be positioned within a flow channel of a head-mounted device to rigidly couple a camera module to a display module on opposing sides of the flow channel. While only one set of components is shown in FIG. 4, it will be understood that the features thereof can apply to other components (e.g., other camera module, display module, and support member). For example, such features can be the same or similar for different sets of components on either side (e.g., right or left) of the head-mounted device.

As shown in FIG. 4, the camera module 130 can be positioned on the outer side 122 of the frame 110. Additionally, the display module 140 can be positioned on an inner side 124 of the frame 110. The camera module 130 can be rigidly coupled to the display module 140 by a support member 170 that extends through the flow channel 114. Additionally, the support member 170 can extend through each of opposing walls 118 that define at least a portion of the outer periphery of the flow channel 114. At least one of the walls 118 can provide the track 132 that can guide movement of the camera module 130 and/or the display module 140. The rigid coupling provided by the support member 170 can facilitate simultaneous movement of both the camera module 130 and the display module 140. As used herein, a rigid coupling is a mechanical connection between at least two components that facilitates simultaneous movement of the components in unison. For example, a rigid coupling can ensure that when one component moves in a given direction by a given distance, the other component also moves in the same direction by the same distance.

While only one support member 170 is shown in FIG. 4, it will be understood that any number of support members 170 can be provided. For example, multiple support members 170 can be distributed and extend through the track 132 or another track. Multiple support members 170 can increase the rigidity of the coupling between the camera module 130 and the display module 140. Individual support members can optionally be placed outside the wake of another and/or every other support member. For example, the support members can be distributed so that each receives undisturbed flow incident upon the corresponding support member, rather than the flow disturbed by the wake of another support member.

The display module 140 can be adjusted to align with the corresponding eye of the user, and the camera module 130 can be correspondingly adjusted so that the field of view provided by the display module 140 corresponds to a field of view captured by the camera module 130. Accordingly, the display module 140 is able to accurately reproduce, simulate, or augment a view based on a view captured by the camera module 130 with an alignment that corresponds to the view that the user would have naturally without the head-mounted device 100. This alignment is maintained by the rigid coupling of the support member 170. By extending directly between the camera module 130 and the display module 140, the support member 170 can provide a shorter length than would be provided by extending outside the flow channel 114. As such, the support member 170 is more resistant to flexing and bending that would interfere with the alignment of the camera module 130 and the display module 140.

As further shown in FIG. 4, the position of the support member 170 within the flow channel 114 allows air to flow around and/or through the support member 170. Such flow can be provided by the blower 150, which can be positioned upstream and/or downstream of the support member 170. The blower 150 can further provide cooling to one or more additional components 160 of the head-mounted device 100. The flow channel 114 can extend across, near, or adjacent to a component 160 to be cooled. It will be appreciated that the component to be cooled can be any component of the head-mounted device 100. For example, the component to be cooled can be an electronic component, a controller, a processor, a battery, a sensor, an antenna, or any component in thermal connection with another component to be cooled through heat dissipation. By further example, the component to be cooled can be the support member 170 and any structures connected thereto. The flow channel 114 can connect the blower 150 directly to the component to be cooled. For example, the flow channel 114 can expose at least a portion of the component so that a flow provides cooling directly to the component. Additionally or alternatively, the flow channel 114 can be defined by one or more structures that are thermally connected to the component to be cooled. For example, a heat sink can be provided as thermally connected to the component and/or as a portion of the component. The component and/or the heat sink to be cooled can be near, adjacent to, contacting, and/or exposed to the flow channel 114 and/or a structure defining the flow channel 114 (e.g., inlet, outlet, and/or walls). Accordingly, flow or air of another fluid through the flow channel 114 can provide convection for removing heat from the component and/or the heat sink during operation.

A rotational speed of the blower 150 can be controlled to provide effective cooling at an acceptable sound level. Where multiple blowers are provided, the number of blowers can be controlled to manage the amount of cooling provided and the amount of noise produced. Additionally or alternatively, each of multiple blowers can be controlled independently to provide different cooling actions and/or to produce noise at different sound levels, different frequencies, and/or other parameters.

Figure 5:
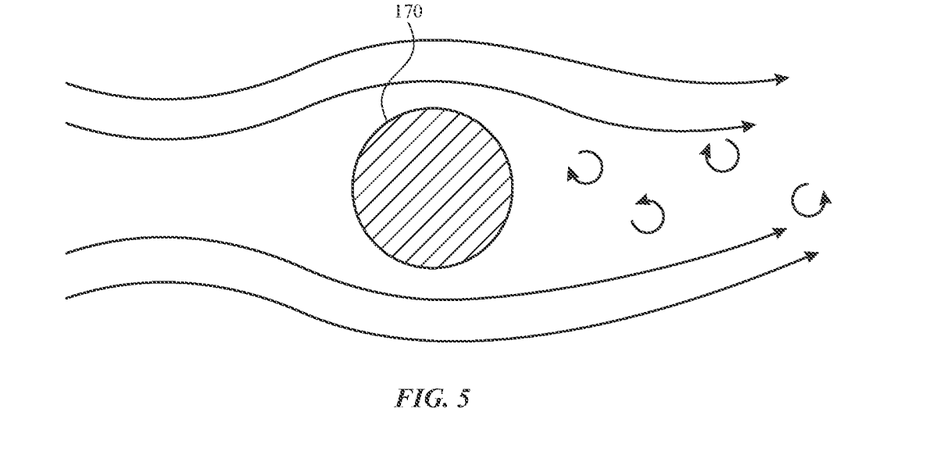
FIG. 5 illustrates a sectional view of a support member in a flow channel of the head-mounted device of FIG. 4 taken along line B-B, according to some embodiments of the present disclosure.

Referring now to FIG. 5, a support member can be configured to reduce tonal noises that are produced as air flows around the support member. As shown in FIG. 5, as air passes around the support member 170, a region downstream of the support member 170 can be of a relatively lower pressure. In this region, vortices are formed in a periodic manner and on opposite sides of the support member 170. The periodicity of the formation and shedding of vortices behind the support member 170 defines a frequency at which a corresponding tonal noise is generated. This tonal noise may be perceived as whistling or high-pitched noise by a user in the vicinity thereof. As used herein, a tonal noise is sound generated by the periodic formation and shedding of vortices behind a support member. As used herein, a broadband noise is an aggregate of other sounds that are formed from one or more of a variety of sources. The broadband noises can be produced at or near the blower, the inlet, the outlet, and/or the flow channel. The broadband noise can have a distribution of frequencies that it broader than a distribution of frequencies of the tonal noise.

The vortex shedding described herein is an oscillating flow that takes place when air flows past the support member, depending on the size and shape of the body. In this flow, vortices are created at the downstream side of the support member and detach periodically from either side of the body. The air flow past the support member creates alternating low-pressure vortices on the downstream side of the support member. The vortex shedding frequency is defined by the Strouhal number, $S_t$, a dimensionless number describing oscillating flow mechanisms and given by:

$$S_t = \frac{fd}{V}, \qquad \text{Eq. 1}$$

where f is the shedding frequency, d is diameter, and V is the flow velocity. $S_t$ is constant for a given cross-sectional geometry and flow regime. It will be recognized that, because $S_t$ is constant, variations in diameter and velocity will produce different frequencies.

Figure 6:
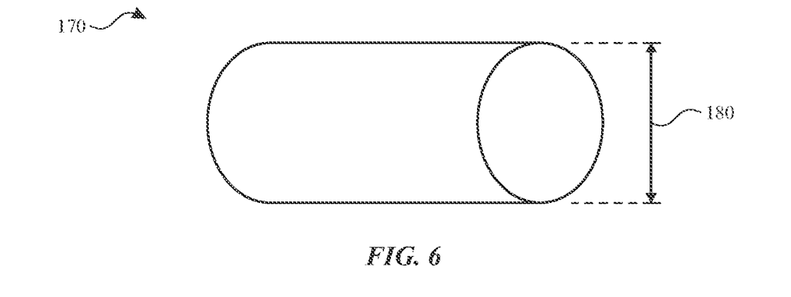
FIG. 6 illustrates a perspective view of a support member having a constant cross-sectional dimension across its length, according to some embodiments of the present disclosure.
Figure 7:
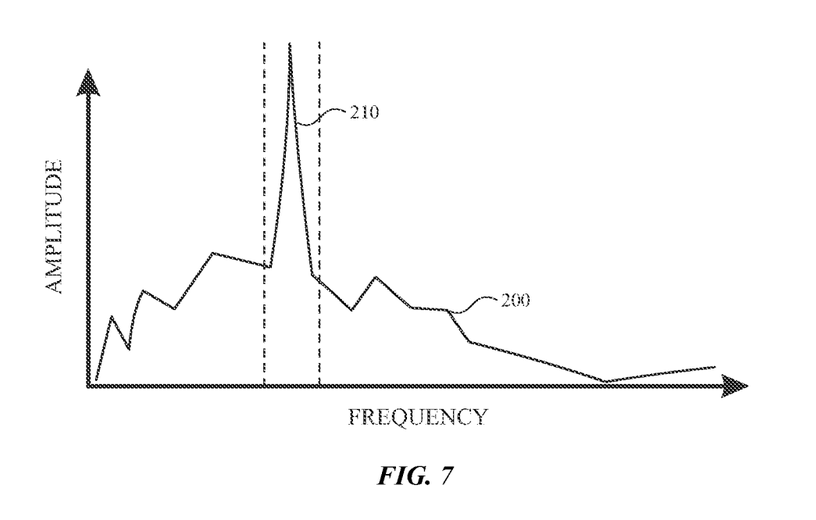
FIG. 7 illustrates a graph including a plot of amplitudes for a range of frequencies for sound produced by flow through a flow channel and across the support member of FIG. 6, according to some embodiments of the present disclosure.

Referring now to FIGS. 6 and 7, a geometry of a support member contributes to the characteristics of noises generated as air flows around the support member. Such characteristics (e.g., frequency and amplitude) can be controlled by selecting a support member with a geometry that facilitates masking of tonal noises. It will be understood that a variety of noises are produced during operation of the head-mounted device 100. It can be desirable to distribute tonal noises so that they become less distinguishable from other noises.

In the example of FIG. 6, a support member 170 with a generally cylindrical shape is provided. The support member 170 can provide a uniform cross-sectional geometry 180 (e.g., dimension, diameter, etc.) along a length thereof. The length can be an entire length of the support member 170 or a portion thereof that resides within the flow channel. As used herein, a cross-sectional dimension is a length that can be measured as between two points on an outer periphery of an object and through the cross-section of the object. A diameter is an example of a cross-sectional dimension. Different cross-sectional dimensions of a given object can be measured through different cross-sections along an axis of the object.

Due to a uniform cross-sectional dimension 180 as shown in FIG. 6, tonal noises with a uniform frequency will be produced along the length of the support member 170. As an example of the noise signature of the head-mounted device, as shown in FIG. 7, a variety of noises combine to form broadband noise 200, which is widely distributed across a broad range of frequencies. In contrast, tonal noises produced at the support member have a uniform frequency and create a tonal spike 210 at a relatively narrow range of frequencies. Accordingly, the tonal noise represented by the tonal spike 210 is prominent and distinguishable from the broadband noise 200.

Figure 8:
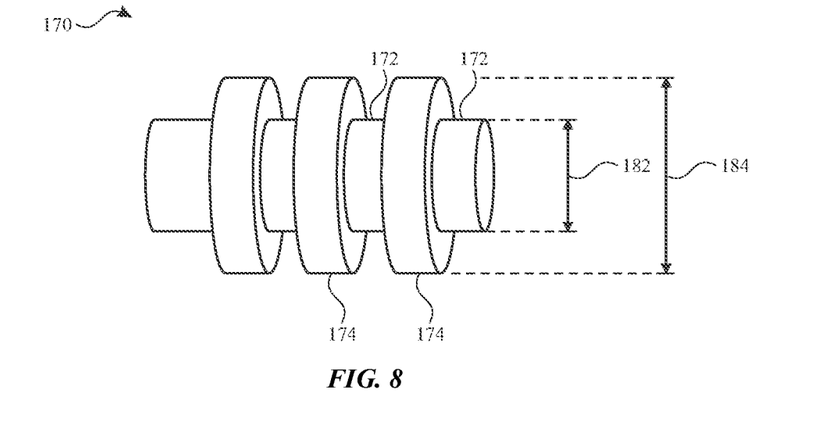
FIG. 8 illustrates a perspective view of a support member having a variable (e.g., stepwise) cross-sectional dimension across its length, according to some embodiments of the present disclosure.
Figure 9:
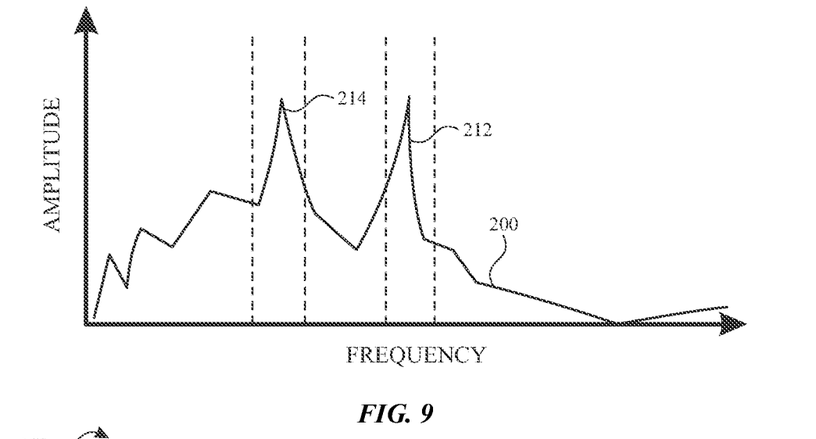
FIG. 9 illustrates a graph including a plot of amplitudes for a range of frequencies for sound produced by flow through a flow channel and across the support member of FIG. 8, according to some embodiments of the present disclosure.

Referring now to FIGS. 8 and 9, a geometry of a support member can distribute tonal noises across a continuous range of frequencies to allow the tonal noise to be more effectively masked by the broadband noise. As shown in FIG. 8, a support member 170 can include first sections 172 and second sections 174 along the length of the support member 170. The first sections 172 can each have a first cross-sectional dimension 182 (e.g., diameter). The second sections 174 can each have a second cross-sectional dimension 184 (e.g., diameter) that is greater than the first cross-sectional dimension 182. Accordingly, tonal noises with different frequencies will be produced at the different sections have different cross-sectional dimensions. For example, as shown in FIG. 9, different tonal noises produced at the different sections of the support member create different tonal spikes 212 and 214. Each of the tonal spikes 212 and 214 occur with less amplitude than the single tonal spike shown in FIG. 7. Accordingly, the tonal noises represented by the tonal spikes 212 and 214 are less prominent and less distinguishable from the broadband noise 200 than would be a single tonal spike. Furthermore, the tonal noise can be tuned by selecting sections having particular cross-sectional dimensions. The frequencies can be tuned to be within a range that corresponds to existing broadband noise, so that the tonal noise is masked by the broadband noise.

Figure 10:
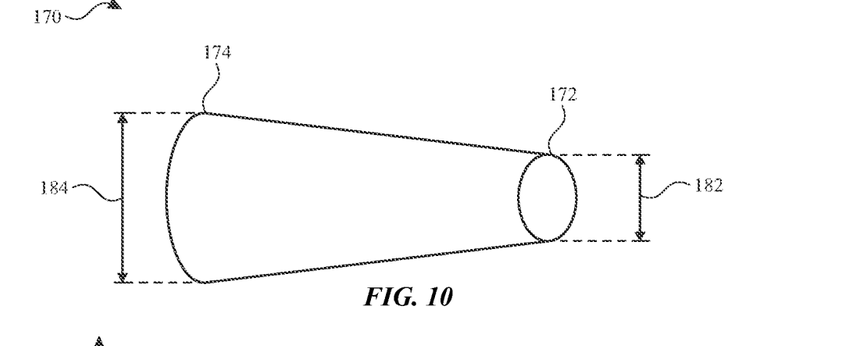
FIG. 10 illustrates a perspective view of a support member having a variable (e.g., tapered) cross-sectional dimension across its length, according to some embodiments of the present disclosure.
Figure 11:
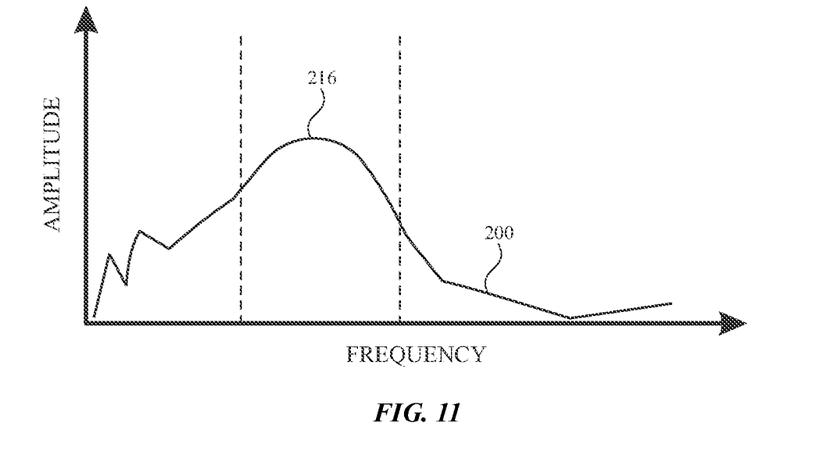
FIG. 11 illustrates a graph including a plot of amplitudes for a range of frequencies for sound produced by flow through a flow channel and across the support member of FIG. 10, according to some embodiments of the present disclosure.

Referring now to FIGS. 10 and 11, another geometry of a support member can evenly distribute tonal noises across a continuous range of frequencies to allow the tonal noise to be more effectively masked by the broadband noise. As shown in FIG. 10, a support member 170 can include first sections 172 and second sections 174 at ends of the support member 170. The first section 172 can have a first cross-sectional dimension 182 (e.g., diameter), and the second section 174 can have a second cross-sectional dimension 184 (e.g., diameter) that is greater than the first cross-sectional dimension 182. The cross-sectional dimensions across the length of the support member 170 can transition from the first cross-sectional dimension 182 to the second cross-sectional dimension 184. For example, the cross-sectional dimension can taper to form a conical or frustoconical shape. Various shapes are contemplated, such as tapers that are linear, curved, and combinations thereof. Accordingly, tonal noises with different frequencies will be produced along the length providing different cross-sectional dimensions. For example, as shown in FIG. 11, different tonal noises produced at the different sections of the support member create a smoothed tonal region 216. The amplitude of the tonal noise is distributed across a continuous range of frequencies within the tonal region 216. Accordingly, the tonal noises represented by the tonal region 216 are less prominent and less distinguishable from the broadband noise 200 than would be one or more discrete tonal spikes. Furthermore, the tonal noise can be tuned by selecting sections having particular cross-sectional dimensions. The frequencies can be tuned to be within a range that corresponds to existing broadband noise, so that the tonal noise is masked by the broadband noise.

Figure 12:
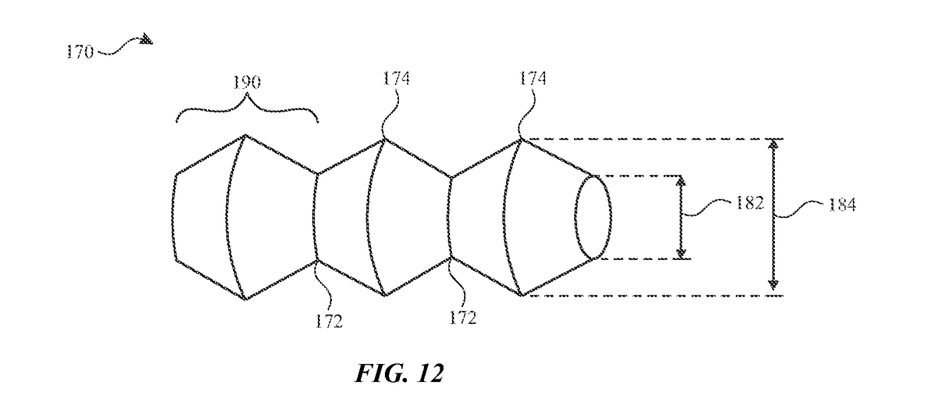
FIG. 12 illustrates a perspective view of a support member having a variable cross-sectional dimension across sections of its length, according to some embodiments of the present disclosure.

Referring now to FIG. 12, other geometries of a support member can distribute tonal noises across a continuous range of frequencies to allow the tonal noise to be effectively masked by the broadband noise. As shown in FIG. 12, a support member 170 can include multiple segments 190. Any number of segments 190 can be included, with each segment 190 being the same or similar to at least one other segment 190. Each of the segments 190 can include a first section 172 and a second section 174. The first section 172 can have a first cross-sectional dimension 182 (e.g., diameter), and the second section 174 can have a second cross-sectional dimension 184 (e.g., diameter) that is greater than the first cross-sectional dimension 182. The cross-sectional dimensions across the length of the support member 170 can alternate and/or transition multiple times between from the first cross-sectional dimension 182 and the second cross-sectional dimension 184. For example, each segment 190 can taper to form conical or frustoconical shapes. Various shapes are contemplated, such as tapers that are linear, curved, and combinations thereof. Accordingly, tonal noises with different frequencies will be produced along the length providing different cross-sectional dimensions. The amplitude of a tonal noise will be distributed across a continuous range of frequencies within a tonal region. The frequencies can be tuned to be within a range that corresponds to existing broadband noise, so that the tonal noise is masked by the broadband noise.

Figure 13:
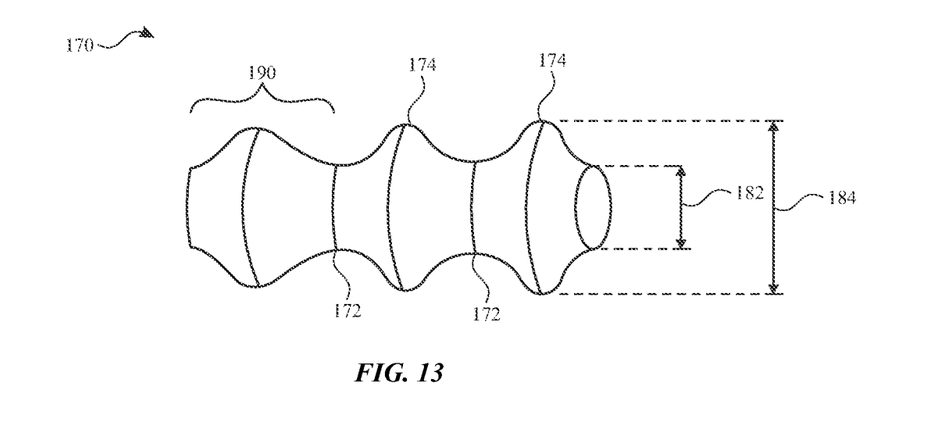
FIG. 13 illustrates a perspective view of a support member having a variable cross-sectional dimension across sections of its length, according to some embodiments of the present disclosure.

Referring now to FIG. 13, other geometries of a support member can also distribute tonal noises across a continuous range of frequencies to allow the tonal noise to be effectively masked by the broadband noise. As shown in FIG. 13, a support member 170 can include multiple segments 190. The cross-sectional dimensions across the length of the support member 170 can alternate and/or transition multiple times between from the first cross-sectional dimension 182 of the first section 172 and the second cross-sectional dimension 184 of the second section 174. For example, each segment 190 can include curves to form undulating profiles. As used herein, a profile is a shape of an object in a cross-section thereof. The shape can include an entirety of the cross-section or a portion thereof. For example, the profile can be defined by the contours of an object as shown by a periphery of the cross-section. Various shapes are contemplated for such profiles, such as sinusoidal, square wave, triangle wave, sawtooth, and combinations thereof. Accordingly, tonal noises with different frequencies will be produced along the length providing different cross-sectional dimensions. The amplitude of a tonal noise will be distributed across a continuous range of frequencies within a tonal region. The frequencies can be tuned to be within a range that corresponds to existing broadband noise, so that the tonal noise is masked by the broadband noise.

Figure 14:
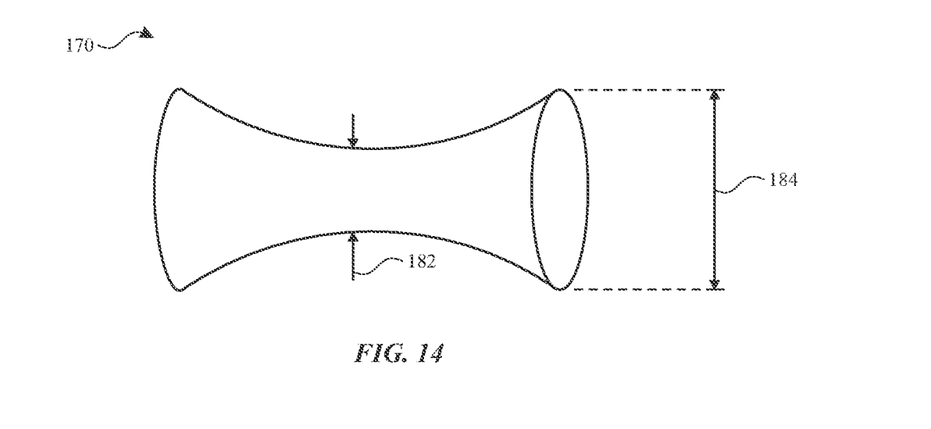
FIG. 14 illustrates a perspective view of a support member having a variable cross-sectional dimension across its length, according to some embodiments of the present disclosure.

Referring now to FIG. 14, a geometries of a support member can address variations in the flow velocity across the support member. As discussed above, the shedding frequency, f, of Eq. 1 can vary based on variations in the flow velocity, V, as well as the diameter, d. Additionally, the flow velocity may be slower adjacent to and along walls of a flow channel than at a region centrally located between the walls. As shown in FIG. 14, the diameter of a support member 170 in the flow channel can be provided with a first cross-sectional dimension 182 and a second cross-sectional dimension 184. The first cross-sectional dimension 182 at the ends of the support member 170 (e.g., where flow is slower along the walls of a flow channel) can be greater than the first cross-sectional dimension 182 (e.g., where flow is faster at a region centrally located between the walls). Various shapes are contemplated for such profiles, such as one or more tapers that are linear, curved, and combinations thereof. Profile shapes can also include step-wise and other non-tapered shapes. Accordingly, the frequency of tonal noise produced along the walls will be lower due to both the larger diameter and slower air flow. Likewise, the frequency of tonal noise produced at a region centrally located between the walls will be higher due to both the smaller diameter and faster air flow. As such, the amplitude of a tonal noise will be distributed across a continuous range of frequencies within a tonal region. The frequencies can be tuned to be within a range that corresponds to existing broadband noise, so that the tonal noise is masked by the broadband noise.

Figure 15:
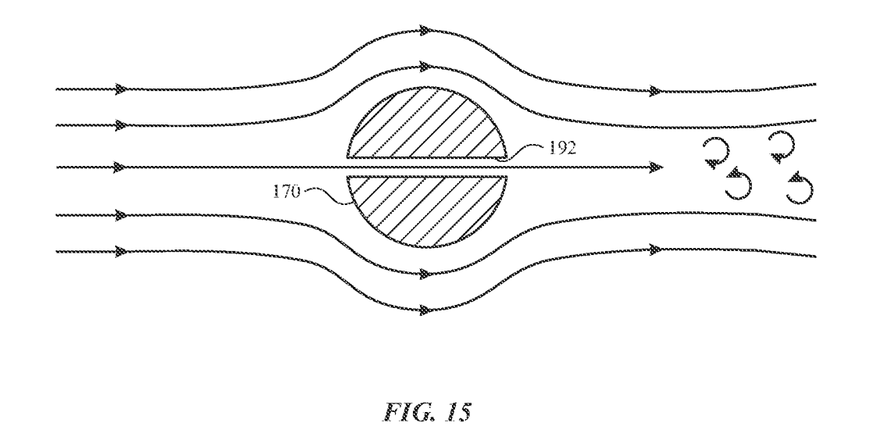
FIG. 15 illustrates a sectional view of a support member in a flow channel, according to some embodiments of the present disclosure.

Referring now to FIG. 15, a support member can include other features that affect the flow with respect to the support member. For example, as shown in FIG. 15, a support member 170 can include a slot 192 that extends through at least a portion of the support member 170. The slot 192 can extend along a direction that is parallel to or similar to a direction of flow upstream and/or downstream of the support member 170. It will be recognized that any number of slots can be provided in any number of sizes, shapes, positions, and/or orientations.

Figure 16:
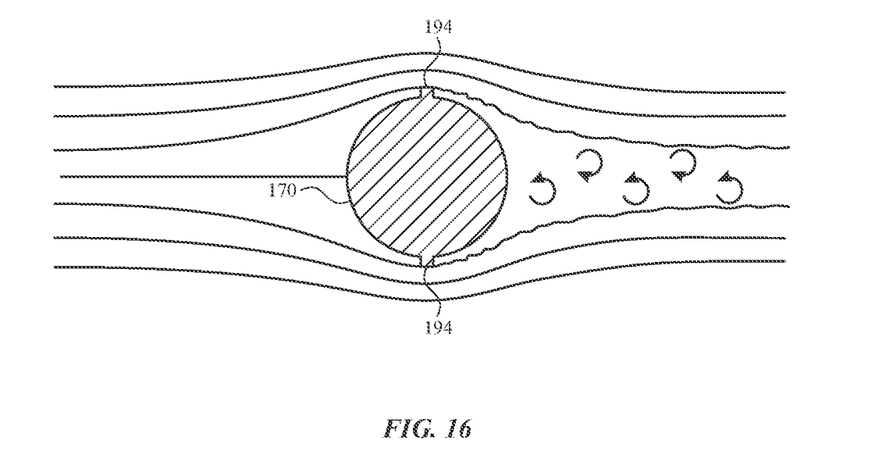
FIG. 16 illustrates a sectional view of a support member in a flow channel, according to some embodiments of the present disclosure.

Referring now to FIG. 16, a support member can include surface features that affect the flow with respect to the support member. For example, as shown in FIG. 16, a support member 170 can include one or more protrusions 194 extending from a base or core of the support member 170. The one or more protrusions 194 can be positioned on opposite sides of the support member 170. The one or more protrusions 194 can be positioned at any angular position around the circumference of the support member 170. It will be recognized that any number of protrusions can be provided in any number of sizes, shapes, positions, and/or orientations. The one or more protrusions 194 can cause a laminar boundary layer of the flow to undergo a transition to a turbulent state, such that the wake downstream of the support member 170 is narrower and more disorganized than it would be without the protrusions 194. Such an arrangement can alter the frequency of any resulting tonal noise and/or reduce the tonality by disorganizing the wake flow. Accordingly, the frequencies can be tuned to be within a range that corresponds to existing broadband noise, so that the tonal noise is masked by the broadband noise.

Surface features of a support member can be produced by one or more of a variety of mechanisms. For example, the support member can be shaped to include protrusions extending from a base structure, as discussed herein. Additionally or alternatively, other surface features, such as textures can be provided. Such textures can be of a repeating pattern across at least a portion of the support member. By further example, textures can be provided based on the manner in which the support member is formed, such as by casting the support member to produce and maintain surface textures. Such textures may be patterned or random. As with the protrusions, such textures can cause a laminar boundary layer of the flow to undergo a transition to a turbulent state, such that the wake downstream of the support member is narrower and more disorganized than it would be without the texture. Such an arrangement can alter the frequency of any resulting tonal noise and/or reduce the tonality by disorganizing the wake flow. Accordingly, the frequencies can be tuned to be within a range that corresponds to existing broadband noise, so that the tonal noise is masked by the broadband noise.

As discussed above, the shedding frequency, f, of Eq. 1 can vary based on variations in the flow velocity, V, as well as the diameter, d. The flow velocity can be controlled based, at least in part, on the operation of the one or more blowers. The blowers be operated based, at least in part, on a demand for cooling of one or more components of the head-mounted device. The blowers can be operated based, at least in part, on a target frequency of tonal noise. For example, the blowers can be operated so that frequencies of tonal noise are within a range that corresponds to existing broadband noise, so that the tonal noise is masked by the broadband noise.

Figure 17:
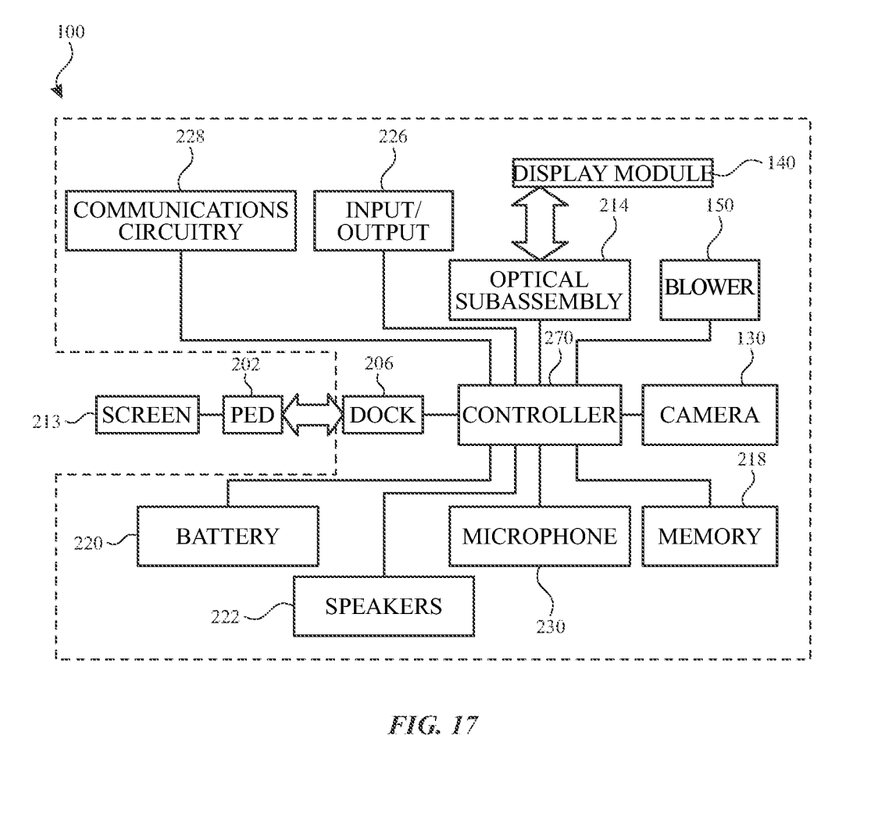
FIG. 17 illustrates a block diagram of a head-mounted device, in accordance with some embodiments of the present disclosure.

Referring now to FIG. 17, components of the head-mounted device can be operably connected to provide the performance described herein. FIG. 17 shows a simplified block diagram of an illustrative head-mounted device 100 in accordance with one embodiment of the invention. It will be appreciated that components described herein can be provided on either or both of a frame and/or a securement element of the head-mounted device 100.

As shown in FIG. 17, the head-mounted device 100 can include a controller 270 with one or more processing units that include or are configured to access a memory 218 having instructions stored thereon. The instructions or computer programs may be configured to perform one or more of the operations or functions described with respect to the head-mounted device 100. The controller 270 can be implemented as any electronic device capable of processing, receiving, or transmitting data or instructions. For example, the controller 270 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 218 can store electronic data that can be used by the head-mounted device 100. For example, the memory 218 can store electrical data or content such as, for example, audio and video files, documents and applications, device settings and user preferences, timing and control signals or data for the various modules, data structures or databases, and so on. The memory 218 can be configured as any type of memory. By way of example only, the memory 218 can be implemented as random access memory, read-only memory, Flash memory, removable memory, or other types of storage elements, or combinations of such devices.

The head-mounted device 100 can further include a display module 140 for displaying visual information for a user. The display module 140 can provide visual (e.g., image or video) output. The display module 140 can be or include an opaque, transparent, and/or translucent display. The display module 140 may have a transparent or translucent medium through which light representative of images is directed to a user's eyes. The display module 140 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mounted device 100 can include an optical subassembly 214 configured to help optically adjust and correctly project the image based content being displayed by the display module 140 for close up viewing. The optical subassembly 214 can include one or more lenses, mirrors, or other optical devices.

Head-mounted device 100 can include a battery 220, which can charge and/or power components of the head-mounted device 100. The battery 220 can also charge and/or power components connected to the head-mounted device 100, such as a portable electronic device 202, as discussed further herein.

Head-mounted device 100 can include the blower 150 and/or any other suitable component for cooling down components of the head-mounted device 100. Suitable components can include, for example, blowers, pipes for transferring heat, vents, apertures, holes, any other component suitable for distributing and diffusing heat, or any combination thereof. The blower 150 may also or instead be manufactured from materials selected for heat dissipation properties. For example, a housing of the head-mounted device 100 may be configured to distribute heat away from components thereof and/or the user.

The head-mounted device 100 can include an input/output component 226, which can include any suitable component for connecting head-mounted device 100 to other devices. Suitable components can include, for example, audio/video jacks, data connectors, or any additional or alternative input/output components.

The head-mounted device 100 can include communications circuitry 228 for communicating with one or more servers or other devices using any suitable communications protocol. For example, communications circuitry 228 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 228 can also include an antenna for transmitting and receiving electromagnetic signals.

The head-mounted device 100 can include the microphone 230 as described herein. The microphone 230 can be operably connected to the controller 270 for detection of sound levels and communication of detections for further processing, as described further herein.

The head-mounted device 100 can include the speakers 222 as described herein. The speakers 222 can be operably connected to the controller 270 for control of speaker output, including sound levels, as described further herein.

The head-mounted device 100 can optionally connect to a portable electronic device 202, which can provide certain functions. For the sake of brevity, the portable electronic device 202 will not be described in detail in FIG. 17. It should be appreciated, however, that the portable electronic device 202 may be embodied in a variety of forms including a variety of features, all or some of which can be utilized by the head-mounted device 100 (e.g., input/output, controls, processing, battery, etc.). The portable electronic device 202 can receiving cooling from operation of the blower 150. The portable electronic device 202 can provide a handheld form factor (e.g., small portable electronic device which is light weight, fits in a pocket, etc.). Although not limited to these, examples include media players, phones (including smart phones), PDAs, computers, and the like. The portable electronic device 202 may include a screen 213 for presenting the graphical portion of the media to the user. The screen 213 can be utilized as the primary screen of the head-mounted device 100.

The head-mounted device 100 can include a dock 206 operative to receive the portable electronic device 202. The dock 206 can include a connector (e.g., Lightning, USB, FireWire, power, DVI, etc.), which can be plugged into a complementary connector of the portable electronic device 202. The dock 206 may include features for helping to align the connectors during engagement and for physically coupling the portable electronic device 202 to the head-mounted device 100. For example, the dock 206 may define a cavity for placement of the portable electronic device 202. The dock 206 may also include retaining features for securing portable electronic device 202 within the cavity. The connector on the dock 206 can function as a communication interface between the portable electronic device 202 and the head-mounted device 100.

The head-mounted device 100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

Accordingly, embodiments of the present disclosure provide a head-mounted device that effectively manages heat while also managing noise output in a manner that reduces the user's perception thereof. For example, a support member extending across a flow channel can provide multiple sections with different profiles and/or cross-sectional dimensions within the flow channel. Each of the profiles and/or cross-sectional dimensions can generate tonal noises at different frequencies, so that the tonal noises generated are distributed across multiple frequencies to mask such tonal noises among broadband noises that are generated by the head-mounted device. Such a support member can be moveably positioned within the flow channel and rigidly coupled to other components of the head-mounted device, such as a camera on an outer side of the head-mounted device and a display module on an inner side of the head-mounted device. Such a support member can also be used to draw heat away from other components of the head-mounted device to be dissipated by the flow of air within the flow channel.

Various examples of aspects of the disclosure are described below as clauses for convenience. These are provided as examples, and do not limit the subject technology.

Clause A: a head-mounted device comprising: a frame having an outer side and an inner side; a camera module on the outer side of the frame; a display module on the inner side of the frame; a flow channel within the frame; a support member rigidly coupling the camera module to the display module, the support member having multiple sections with different cross-sectional dimensions within the flow channel; and a blower for moving air through the flow channel and across the support member.

Clause B: a head-mounted device comprising: a frame; a flow channel within the frame; a blower for cooling the head-mounted device by moving air through the flow channel; and a support member moveably positioned within the flow channel, the support member comprising: a first section having a first profile that, with the air moved by the blower, generates a first tonal noise at a first frequency; and a second section having a second profile that, with the air moved by the blower, generates a second tonal noise at a second frequency different than the first frequency.

Clause C: a head-mounted device comprising: a frame defining an inlet, an outlet, and walls; a flow channel between the walls and connecting the inlet to the outlet; and a support member moveably positioned within the flow channel and extending through the walls, the support member comprising: outer sections each being positioned adjacent to a corresponding one of the walls and having a first cross-sectional dimension; and an inner section being positioned between the outer sections and having a second cross-sectional dimension less than the first cross-sectional dimension.

One or more of the above clauses can include one or more of the features described below. It is noted that any of the following clauses may be combined in any combination with each other, and placed into a respective independent clause, e.g., clause A, B, or C.

Clause 1: the camera module is a first camera module; the display module is a first display module; the support member is a first support member; the head-mounted device further comprises: a second camera module on the outer side of the frame; a second display module on the inner side of the frame; a second support member rigidly coupling the second camera module to the second display module, the second support member having multiple sections with different cross-sectional dimensions.

Clause 2: an electronic component, wherein the air moved by the blower cools the electronic component.

Clause 3: a heat sink thermally connecting the electronic component to the flow channel.

Clause 4: the camera module, the display module, and the support member are moveable in unison and with respect to the frame.

Clause 5: the display module is moveable to be aligned with an eye of a user wearing the head-mounted device.

Clause 6: each of the sections of the support member forms a cylindrical shape.

Clause 7: the support member tapers across a length thereof within the flow channel.

Clause 8: each of the sections of the support member forms a conical shape.

Clause 9: the support member provides a slot extending through the support member in a direction of the flow channel.

Clause 10: the support member provides a cylindrical shape with protrusions extending on opposing sides of the support member.

Clause 11: the first frequency and the second frequency are within a range of frequencies of broadband noise produced at the blower, an inlet, and an outlet.

Clause 12: an additional support member in the flow channel, wherein neither of the support members is within wake of the other.

Clause 13: the support member is moveable with a camera and a display module of the head-mounted device to align the display module with an eye of a user wearing the head-mounted device.

Clause 14: each of the walls comprise a track, and the support member is moveable along and within each of the tracks.

Clause 15: a blower for moving air through the flow channel to cool the head-mounted device.

Clause 16: a blower configured to move air across inner section at a flow velocity that is higher than a flow velocity of air across the outer sections.

Clause 17: the inner section is configured to produce a first tonal noise at a first frequency, and the outer sections are configured to produce a second tonal noise at a second frequency that is lower than the first frequency.

As described above, one aspect of the present technology may include the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A head-mounted device comprising:
   a frame;
   a camera module on an outer side of the frame;
   a display module on an inner side of the frame, opposite the outer side;
   a flow channel within the frame and comprising:
      multiple inlets at a bottom portion of the frame, the bottom portion joining the outer side and the inner side; and
      an outlet at a top portion of the frame, the top portion joining the outer side and the inner side and being opposite the bottom portion; and
   a blower for moving air through the flow channel.

2. The head-mounted device of claim 1, further comprising a support member rigidly coupling the camera module to the display module.

3. The head-mounted device of claim 2, wherein:
   the camera module is a first camera module;
   the display module is a first display module;
   the support member is a first support member; and
   the head-mounted device further comprises:
      a second camera module on the outer side of the frame;
      a second display module on the inner side of the frame; and
      a second support member rigidly coupling the second camera module to the second display module, the second support member having multiple sections with different cross-sectional dimensions.

4. The head-mounted device of claim 2, wherein the support member comprises multiple sections with different cross-sectional dimensions within the flow channel.

5. The head-mounted device of claim 2, wherein the camera module, the display module, and the support member are moveable in unison and with respect to the frame.

6. The head-mounted device of claim 1, further comprising an electronic component, wherein the air moved by the blower cools the electronic component.

7. The head-mounted device of claim 6, further comprising a heat sink thermally connecting the electronic component to the flow channel.

8. The head-mounted device of claim 1, wherein the display module is moveable to be aligned with an eye of a user wearing the head-mounted device.

9. A head-mounted device comprising:
   a frame;
   a first flow channel within the frame and connecting a first inlet on a bottom portion of the frame to an outlet on a top portion of the frame, opposite the bottom portion;
   a second flow channel within the frame and connecting a second inlet on the bottom portion of the frame to the outlet;
   a first blower within the first flow channel; and
   a second blower within the second flow channel.

10. The head-mounted device of claim 9, wherein:
    the first blower is positioned adjacent to the first inlet; and
    the second blower is positioned adjacent to the second inlet.

11. The head-mounted device of claim 9, further comprising:
    a first support member movably positioned within the first flow channel; and
    a second support member movably positioned within the second flow channel.

12. The head-mounted device of claim 11, wherein:
    the first support member positioned between the first inlet and the outlet; and
    the second support member positioned between the second inlet and the outlet.

13. The head-mounted device of claim 12, wherein:
    the first blower is positioned between the first inlet and the first support member; and
    the second blower is positioned between the second inlet and the second support member.

14. A head-mounted device comprising:
    a frame defining opposing walls;
    a first flow channel between the opposing walls and connecting a first inlet to an outlet;
    a second flow channel between the opposing walls and connecting a second inlet to the outlet;
    a first support member movably positioned within the first flow channel and extending through each of the opposing walls; and
    a second support member movably positioned within the second flow channel and extending through each of the opposing walls.

15. The head-mounted device of claim 14, wherein:
    the first inlet is on a bottom portion of the frame;
    the second inlet is on the bottom portion of the frame; and
    the outlet is on a top portion of the frame, opposite the bottom portion.

16. The head-mounted device of claim 14, wherein:
    the first support member is coupled to a first camera module on an outer side of the frame and a first display module on an inner side of the frame; and
    the second support member is coupled to a second camera module on the outer side of the frame and a second display module on the inner side of the frame.

17. The head-mounted device of claim 16, wherein:
    the first camera module, the first display module, and the first support member are moveable in unison and with respect to the frame; and
    the second camera module, the second display module, and the second support member are moveable in unison and with respect to the frame.

18. The head-mounted device of claim 14, further comprising:
    a first blower within the first flow channel; and
    a second blower within the second flow channel.

19. The head-mounted device of claim 14, wherein each of the opposing walls comprises tracks, and each of the first support member and the second support member is moveable along and within a corresponding pair of the tracks.

20. The head-mounted device of claim 14, wherein neither one of the first support member nor the second support member is within a wake of the other.

* * * * *

UNITED STATES PATENT AND TRADEMARK OFFICE
CERTIFICATE OF CORRECTION

PATENT NO. : 12,101,918 B2
APPLICATION NO. : 18/225036
DATED : September 24, 2024
INVENTOR(S) : Ivan S. Marić et al.

It is certified that error appears in the above-identified patent and that said Letters Patent is hereby corrected as shown below:

On the Title Page

Under item (72) Inventors:
Replace "Aidan N Zimmerman" with --Aidan N. Zimmerman--;

Under item (56) OTHER PUBLICATIONS:
Replace "dated X Nov." with --dated Nov.--.

Signed and Sealed this
Tenth Day of December, 2024

Katherine Kelly Vidal
*Director of the United States Patent and Trademark Office*